United States Patent
Liu et al.

(10) Patent No.: US 12,134,682 B2
(45) Date of Patent: Nov. 5, 2024

(54) RESIN COMPOSITION AND ARTICLE MADE THEREFROM

(71) Applicant: Elite Material Co., Ltd., Taoyuan (TW)

(72) Inventors: Tse-Hung Liu, Taoyuan (TW); Chia-Hung Wu, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 301 days.

(21) Appl. No.: 17/827,449

(22) Filed: May 27, 2022

(65) Prior Publication Data

US 2023/0331916 A1    Oct. 19, 2023

(30) Foreign Application Priority Data

Apr. 19, 2022  (TW) .................................. 111114796

(51) Int. Cl.
| | | |
|---|---|---|
| *C08L 71/12* | (2006.01) | |
| *C08G 73/10* | (2006.01) | |
| *C08J 5/24* | (2006.01) | |
| *H05K 3/38* | (2006.01) | |

(52) U.S. Cl.
CPC ............ *C08G 73/1042* (2013.01); *C08J 5/24* (2013.01); *C08L 71/12* (2013.01); *H05K 3/386* (2013.01); *C08L 2203/16* (2013.01); *C08L 2203/20* (2013.01); *H05K 2201/0154* (2013.01)

(58) Field of Classification Search
CPC .......................... C08L 71/12; C08G 73/1042
See application file for complete search history.

(56) References Cited

U.S. PATENT DOCUMENTS

| | | | | |
|---|---|---|---|---|
| 9,296,928 | B2 * | 3/2016 | Shin | C08L 79/04 |
| 9,926,435 | B2 * | 3/2018 | Hsieh | C08J 5/18 |
| 10,414,916 | B2 * | 9/2019 | Yao | C08L 79/02 |
| 10,717,807 | B1 * | 7/2020 | Lin | C08L 63/00 |
| 11,111,383 | B2 * | 9/2021 | Chang | C08J 5/249 |
| 11,370,885 | B2 * | 6/2022 | Yao | C08L 25/16 |
| 11,680,139 | B2 * | 6/2023 | Kumazawa | C08G 73/1025 528/310 |
| 11,713,391 | B2 * | 8/2023 | Ming | C08L 33/24 525/205 |
| 2014/0199549 | A1 * | 7/2014 | Shin | C08G 59/186 525/326.7 |
| 2017/0260364 | A1 * | 9/2017 | Hsieh | C08J 5/244 |
| 2018/0086911 | A1 * | 3/2018 | Yao | H05K 1/0353 |
| 2021/0009759 | A1 * | 1/2021 | Yao | C08J 5/18 |
| 2021/0108075 | A1 * | 4/2021 | Chang | B32B 7/06 |
| 2022/0204694 | A1 * | 6/2022 | Kumazawa | H05K 1/0373 |
| 2022/0204746 | A1 * | 6/2022 | Ming | C08J 5/246 |

\* cited by examiner

*Primary Examiner* — Margaret G Moore
(74) *Attorney, Agent, or Firm* — MUNCY, GEISSLER, OLDS & LOWE, P.C.

(57) ABSTRACT

A resin composition includes 10 parts by weight of a first prepolymer and 5 parts by weight to 30 parts by weight of a vinyl group-containing polyphenylene ether resin, wherein the first prepolymer is prepared by subjecting a reaction mixture to a prepolymerization reaction, and the reaction mixture including a polyphenylmethane maleimide, a compound of Formula (1) and a compound of Formula (2) at a weight ratio of 100:10-30:15-45, and the resin composition is absent of a second prepolymer which is prepared by subjecting a maleimide and bis(trifluoromethyl)benzidine to a prepolymerization reaction. An article made from the resin composition may achieve improvement in at least one of the properties including ratio of electroless copper plating, storage modulus and copper foil peeling strength.

9 Claims, No Drawings

RESIN COMPOSITION AND ARTICLE MADE THEREFROM

CROSS-REFERENCE TO RELATED APPLICATION

This application claims the priority benefits of Taiwan Patent Application No. 111114796, filed on Apr. 19, 2022. The entirety the above-mentioned patent application is hereby incorporated by reference herein and made a part of this specification.

BACKGROUND

1. Field of the Disclosure

The present disclosure relates to a resin composition and more particularly to a resin composition useful for preparing a prepreg, a resin film, a laminate or a printed circuit board.

2. Description of Related Art

In recent years, due to the development of electronic signal transmission toward 5G and the trend of high performance and miniaturization of electronic equipment, communication devices and personal computers, the requirements for wiring laminates are increasing, and the trace design is getting more complicated. Correspondingly, the requirements for number of layers of the wiring laminate are increasing, the number of holes on the same wiring laminate is also increasing, and the hole diameter is getting smaller. A smaller hole diameter will increase the difficulty in electroless copper plating on the hole wall and lower the ratio of electroless copper plating. Therefore, it is necessary to develop a material that can meet the high ratio of electroless copper plating (such as 100%) to enhance the yield of the circuit boards; in addition, to meet higher requirements for overall performance of the laminate, it is also necessary to develop a material with high copper foil peeling strength at the same time.

SUMMARY

To overcome the problems of prior arts, particularly one or more above-mentioned technical problems facing conventional materials, it is a primary object of the present disclosure to provide a resin composition and an article made therefrom which may overcome at least one of the above-mentioned technical problems.

To achieve the above-mentioned objects, the present disclosure provides a resin composition comprising 10 parts by weight of a first prepolymer and 5 parts by weight to 30 parts by weight of a vinyl group-containing polyphenylene ether resin, wherein:

the first prepolymer is prepared by subjecting a reaction mixture to a prepolymerization reaction, and the reaction mixture comprises a polyphenylmethane maleimide, a compound of Formula (1) and a compound of Formula (2) at a weight ratio of 100:10-30:15-45,

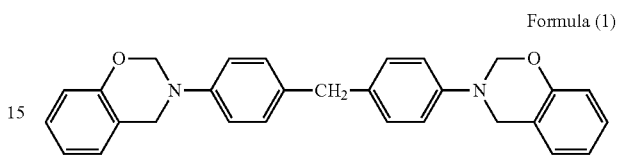

Formula (1)

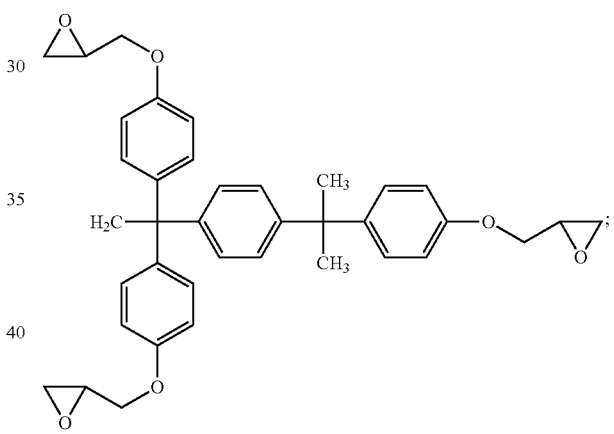

Formula (2)

and the resin composition is absent of a second prepolymer which is prepared by subjecting a maleimide and bis(trifluoromethyl)benzidine to a prepolymerization reaction.

For example, in one embodiment, the vinyl group-containing polyphenylene ether resin comprises a vinylbenzyl group-containing biphenyl polyphenylene ether resin, a methacrylate group-containing polyphenylene ether resin, a vinylbenzyl group-containing bisphenol A polyphenylene ether resin or a combination thereof.

For example, in one embodiment, the resin composition further comprises 5 parts by weight to 35 parts by weight of a maleimide resin, the maleimide resin comprising 3,3'-dimethyl-5,5'-diethyl-4,4'-diphenylmethane bismaleimide, a compound of Formula (3), a compound of Formula (4) or a combination thereof,

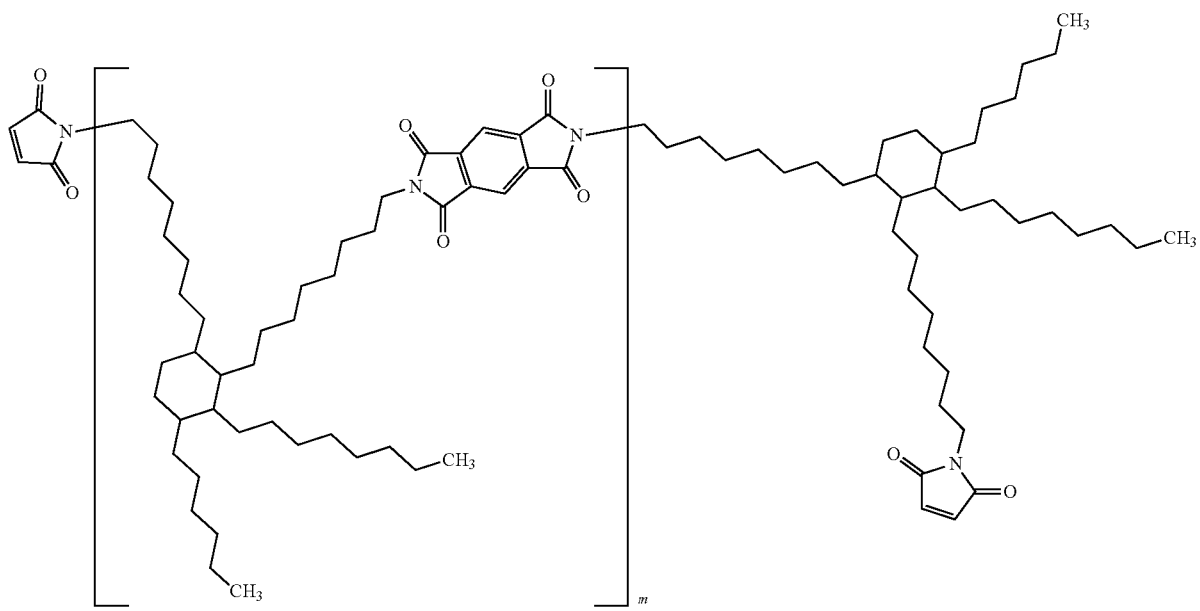

Formula (3), wherein m is an integer of 1 to 10;

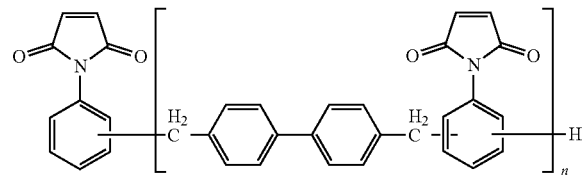

Formula (4), wherein n is an integer of 1 to 5.

For example, in one embodiment, the resin composition further comprises 10 parts by weight to 30 parts by weight of a polyolefin, the polyolefin comprising a styrene-butadiene copolymer, an epoxy group-containing polybutadiene, a styrene-butadiene-divinylbenzene terpolymer or a combination thereof.

For example, in one embodiment, the resin composition further comprises inorganic filler, curing accelerator, flame retardant, polymerization inhibitor, solvent, silane coupling agent, coloring agent, toughening agent or a combination thereof.

Another main object of the present disclosure is to provide an article made from the aforesaid resin composition, comprising a prepreg, a resin film, a laminate or a printed circuit board.

For example, in one embodiment, articles made from the resin composition disclosed herein have one, more or all of the following properties:
 a ratio of electroless copper plating of 100%;
 a storage modulus as measured by reference to IPC-TM-650 2.4.24.4 of greater than or equal to 7.2 GPa; and
 a copper foil peeling strength as measured by reference to IPC-TM-650 2.4.8 of greater than or equal to 0.62 kgf/cm.

DESCRIPTION OF THE EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

As used herein, the term "comprises," "comprising," "includes," "including," "encompass," "encompassing," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed but inherent to such composition or article of manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "encompass," "encompassing," "has," "having" or any other variant thereof, it is understood that close-ended transitional phrases such as "consisting of," "composed by" and "remainder being" and partially open-ended transitional phrases such as "consisting essentially of," "primarily consisting of," "mainly consisting of," "primarily containing," "composed essentially of," "essentially having," etc. are also disclosed and included.

In this disclosure, features and conditions such as values, numbers, contents, amounts or concentrations are presented as a numerical range or a percentage range merely for convenience and brevity. Therefore, a numerical range or a percentage range should be interpreted as encompassing and specifically disclosing all possible subranges and individual numerals or values therein, including integers and fractions, particularly all integers therein. For example, a range of "1.0 to 8.0" or "between 1.0 and 8.0" should be understood as explicitly disclosing all subranges such as 1.0 to 8.0, 1.0 to 7.0, 2.0 to 8.0, 2.0 to 6.0, 3.0 to 6.0, 4.0 to 8.0, 3.0 to 8.0 and so on and encompassing the endpoint values, particularly subranges defined by integers, as well as disclosing all individual values in the range such as 1.0, 2.0, 3.0, 4.0, 5.0, 6.0, 7.0 and 8.0. Unless otherwise defined, the aforesaid interpretation rule should be applied throughout the present disclosure regardless of broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of $X_1$, $X_2$ and $X_3$" and Y is described as being "selected from a group consisting of $Y_1$, $Y_2$ and $Y_3$," the disclosure shall be interpreted as any combination of X is $X_1$ or $X_2$ or $X_3$ and Y is $Y_1$ or $Y_2$ or $Y_3$.

Unless otherwise specified, according to the present disclosure, a compound refers to a chemical substance formed by two or more elements bonded with chemical bonds and may comprise a small molecule compound and a polymer compound, but not limited thereto. Any compound disclosed herein is interpreted to not only include a single chemical substance but also include a class of chemical substances having the same kind of components or having the same property.

As used herein, a prepolymer refers to a product, derived from a compound or a mixture (monomer) that is subjected to prepolymerization (partial polymerization), containing unreacted reactive functional groups or having the potential to undergo further polymerization. For example, the progress of the prepolymerization reaction may be confirmed and controlled as needed by determining the molecular weight or the level of viscosity. Prepolymerization reaction disclosed herein may be initiated by the use of solution and heating or by a thermal melting reaction, but not limited thereto. For example, prepolymerization by the use of solution and heating refers to mixing and dissolving the raw materials in a solvent to obtain a solution, optionally adding a catalyst or a polymerization inhibitor in the solution, followed by heating after all components are melted in the solvent, so as to initiate the prepolymerization reaction. Prepolymerization by a thermal melting reaction refers to heating to melt the raw material and at the same time initiate the prepolymerization reaction. The product after prepolymerization (i.e., the prepolymer) has a molecular weight of greater than that of the compound monomer or mixture monomer prior to prepolymerization and may be analyzed by a gel permeation chromatograph (GPC). In the graph of retention time (X-axis) and molecular weight (Y-axis), the distribution peak of molecular weight of the prepolymer is located closer to the Y-axis (shorter retention time), and the distribution peak of molecular weight of the monomer is located behind (longer retention time). In addition, the prepolymer obtained has a wider distribution of molecular weight that contains multiple adjacent peaks, while the monomer has a narrower distribution of molecular weight that contains only one peak.

To those of ordinary skill in the art to which this disclosure pertains, a resin composition containing an additive and three compounds (e.g., A, B and C), a total of four components, is different form a resin composition containing the additive and a prepolymer formed by the three compounds (e.g., A, B and C), a total of two components, as they are completely different from each other in the aspects of preparation method, physical or chemical properties of the resin composition and properties of an article or product made therefrom. For example, the former involves mixing A, B, C and the additive to form the resin composition; in contrast, the latter involves first subjecting a mixture comprising A, B and C to a prepolymerization reaction at proper conditions to form a prepolymer and then mixing the prepolymer with the additive to form the resin composition. For example, to those of ordinary skill in the art to which this disclosure pertains, the two resin compositions have completely different compositions; in addition, because the prepolymer formed by A, B and C functions completely different from A, B and C individually or collectively in the resin composition, the two resin compositions should be construed as completely different chemical substances and have completely different chemical statuses. For example, to those of ordinary skill in the art to which this disclosure pertains, because the two resin compositions are completely different chemical substances, articles made therefrom will not have the same properties. For example, to a resin composition containing a crosslinking agent and a prepolymer formed by A, B and C, since A, B and C have been partially reacted or converted during the prepolymerization reaction to form the prepolymer, during the process of heating to semi-cure the resin composition at a high temperature condition, a partial crosslinking reaction occurs between the prepolymer and the crosslinking agent but not between A, B and C individually and the crosslinking agent. As such, articles made from the two resin compositions will be completely different and have completely different properties.

Unless otherwise specified, the term "resin" is a widely used common name of a synthetic polymer and is construed in the present disclosure as comprising monomer and its combination, polymer and its combination or a combination of monomer and its polymer, but not limited thereto.

As used herein, "vinyl" or "vinyl group-containing" refers to the presence of an ethylenic carbon-carbon double bond (C=C) or a functional group derived therefrom in a compound. Therefore, examples of "vinyl" or "vinyl group-containing" may include, but not limited to, a structure containing a vinyl group, an allyl group, a vinylbenzyl group, a methacrylate group or the like. Unless otherwise specified, the position of the aforesaid functional group is not particularly limited and may be located at the terminal of a long-chain structure. Therefore, for example, a vinyl group-containing polyphenylene ether resin represents a polyphenylene ether resin containing a vinyl group, an allyl group, a vinylbenzyl group, a methacrylate group or the like, but not limited thereto.

According to the present disclosure, unless otherwise specified, when the term acrylate compound is expressed as (meth)acrylate, it is intended to comprise both situations of containing and not containing a methyl group; for example, cyclohexane dimethanol di(meth)acrylate is construed as including cyclohexane dimethanol diacrylate, cyclohexane dimethanol dimethacrylate or both.

Unless otherwise specified, according to the present disclosure, a modification comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc.

Unless otherwise specified, an alkyl group and an alkenyl group described herein are construed to encompass various isomers thereof. For example, a propyl group is construed to encompass n-propyl and iso-propyl.

As used herein, part(s) by weight represents weight part(s) in any weight unit, such as but not limited to kilogram, gram, pound and so on. For example, 100 parts by weight of the prepolymer may represent 100 kilograms of the prepolymer or 100 pounds of the prepolymer.

The following embodiments and examples are illustrative in nature and are not intended to limit the present disclosure and its application. In addition, the present disclosure is not bound by any theory described in the background and summary above or the following embodiments or examples.

As described above, a primary object of the present disclosure is to provide a resin composition, comprising 10 parts by weight of a first prepolymer and 5 parts by weight to 30 parts by weight of a vinyl group-containing polyphenylene ether resin, wherein:

the first prepolymer is prepared by subjecting a reaction mixture to a prepolymerization reaction, and the reaction mixture comprises a polyphenylmethane maleimide, a compound of Formula (1) and a compound of Formula (2) at a weight ratio of 100:10-30:15-45,

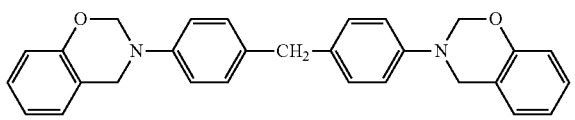

Formula (1)

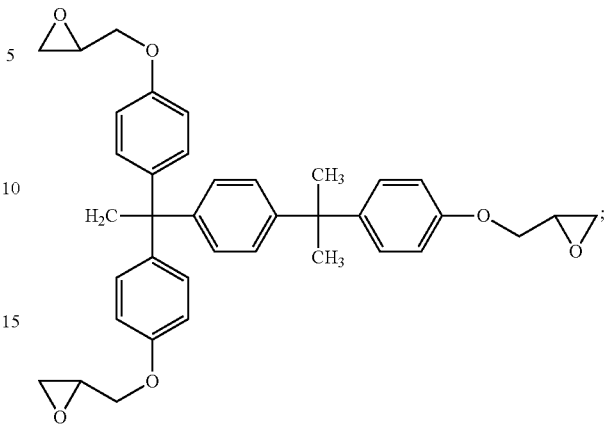

Formula (2)

and
the resin composition is absent of a second prepolymer which is prepared by subjecting a maleimide and bis(trifluoromethyl)benzidine to a prepolymerization reaction.

In the resin composition of the present disclosure, the first prepolymer is prepared by subjecting a reaction mixture to a prepolymerization reaction. For example, the prepolymerization reaction may be that various components in the reaction mixture heated to 180° C. to 400° C. for performing melting and mixing for 6 seconds to 600 seconds, preferably heated to 200° C. to 250° C. for performing melting and mixing for 60 seconds to 200 seconds, so as to obtain the aforesaid first prepolymer, which is a prepolymer formed by a polyphenylmethane maleimide, a compound of Formula (1) and a compound of Formula (2). For example, the prepolymerization reaction may be carried out at a temperature of 180° C., 200° C., 210° C., 220° C., 230° C., 240° C., 250° C., 300° C. or 400° C., but not limited thereto. For example, the duration of the prepolymerization reaction may be 6 seconds, 20 seconds, 70 seconds, 80 seconds, 90 seconds, 100 seconds, 110 seconds, 120 seconds, 130 seconds, 140 seconds, 150 seconds, 160 seconds, 170 seconds, 180 seconds, 190 seconds, 300 seconds, 450 seconds or 600 seconds, but not limited thereto.

In one embodiment, a process for preparing the aforesaid second prepolymer includes heating to melt a maleimide resin to a liquid state, adding bis(trifluoromethyl)benzidine, reacting at 50° C. to 200° C. for 1 to 6 hours, followed by adding a solvent after the reaction is completed and well-stirring, so as to obtain the second prepolymer, which is a prepolymer of a maleimide and bis(trifluoromethyl)benzidine. In another embodiment, a process for preparing the aforesaid second prepolymer includes dissolving a maleimide resin in a solvent, adding bis(trifluoromethyl)benzidine and stirring and mixing until fully dissolved, followed by reacting for 2 to 8 hours at high temperature (such as 50° C. to 150° C.), so as to obtain the second prepolymer, which is a prepolymer of a maleimide and bis(trifluoromethyl)benzidine.

According to the present disclosure, relative to 10 parts by weight of the first prepolymer, the amount of the vinyl group-containing polyphenylene ether resin may be 5 parts by weight to 30 parts by weight.

According to the present disclosure, in the process of making the first prepolymer by subjecting a reaction mixture to a prepolymerization reaction, the weight ratio of a polyphenylmethane maleimide, a compound of Formula (1) and a compound of Formula (2) is 100:10-30:15-45. For example, in one embodiment, relative to 100 parts by weight of the polyphenylmethane maleimide, the reaction mixture may comprise 10 to 30 parts by weight of the compound of Formula (1). For example, in one embodiment, relative to 100 parts by weight of the polyphenylmethane maleimide, the reaction mixture may comprise 15 to 45 parts by weight of the compound of Formula (2).

Unless otherwise specified, the polyphenylmethane maleimide described in various embodiments may comprise various commercially available polyphenylmethane maleimide, such as but not limited to BMI-2300 available from Daiwakasei Industry Co., Ltd.

Unless otherwise specified, the vinyl group-containing polyphenylene ether resin described in various embodiments may comprise various polyphenylene ether resins with terminals modified by a vinyl group, an allyl group, or a (meth)acrylate group, such as a vinylbenzyl group-containing biphenyl polyphenylene ether resin, a methacrylate group-containing polyphenylene ether resin, a vinylbenzyl group-containing bisphenol A polyphenylene ether resin or a combination thereof, but not limited thereto.

For example, in one embodiment, the vinyl group-containing polyphenylene ether resin may comprise various vinyl group-containing polyphenylene ether resins known in the art to which this disclosure pertains. The vinyl group-containing polyphenylene ether resin suitable for the present disclosure is not particularly limited and may comprise any one or more commercially available products, self-prepared products, or a combination thereof. Examples include but are not limited to a polyphenylene ether resin containing a vinyl group, an allyl group, a vinylbenzyl group, or a methacrylate group. For example, in one embodiment, the vinyl group-containing polyphenylene ether resin comprises a vinylbenzyl group-containing biphenyl polyphenylene ether resin, a methacrylate group-containing polyphenylene ether resin (i.e., methacryloyl group-containing polyphenylene ether resin), an allyl group-containing polyphenylene ether resin, a vinylbenzyl group-containing bisphenol A polyphenylene ether resin or a combination thereof. For example, the vinyl group-containing polyphenylene ether resin may be a vinylbenzyl group-containing biphenyl polyphenylene ether resin with a number average molecular weight of about 1200 (such as OPE-2st 1200, available from Mitsubishi Gas Chemical Co., Inc.), a vinylbenzyl group-containing biphenyl polyphenylene ether resin with a number average molecular weight of about 2200 (such as OPE-2st 2200, available from Mitsubishi Gas Chemical Co., Inc.), a methacrylate group-containing polyphenylene ether resin with a number average molecular weight of about 1900 to 2300 (such as SA9000, available from Sabic), a vinylbenzyl group-containing bisphenol A polyphenylene ether resin with a number average molecular weight of about 2400 to 2800 or a combination thereof, but not limited thereto.

According to the present disclosure, the resin composition is absent of a second prepolymer which is prepared by subjecting a maleimide and bis(trifluoromethyl)benzidine to a prepolymerization reaction. If the second prepolymer is added to the aforesaid resin composition, it will deteriorate the ratio of electroless copper plating and the copper foil peeling strength of the resin composition at the same time.

For example, the second prepolymer may be a prepolymer obtained by the reaction of polyphenylmethane maleimide and 4,4'-diamino-2,2'-bis(trifluoromethyl) biphenyl, a prepolymer obtained by the reaction of 2,2'-bis-[4-(4-maleimide phenoxy)phenyl]propane and 4,4'-diamino-2,2'-bis(trifluoromethyl)biphenyl or a prepolymer obtained by the reaction of 1,6-bismaleimide-(2,2,4-trimethyl)hexane and 4,4'-diamino-2,2'-bis(trifluoromethyl)biphenyl.

For example, in one embodiment, relative to 10 parts by weight of the first prepolymer, the resin composition of the present disclosure further comprises 5 parts by weight to 35 parts by weight of the maleimide resin.

For example, in the present disclosure, unless otherwise specified, the term "maleimide resin", optionally added as described above, is construed to encompass a maleimide monomer, a maleimide polymer, a combination of maleimide monomers, a combination of maleimide polymers, and a combination of maleimide monomer(s) and maleimide polymer(s). For example, the maleimide resin refers to a compound, monomer, mixture, or polymer (including oligomer) containing at least one maleimide group. Unless otherwise specified, the optional maleimide resin may include any one or more maleimide resins useful for making a prepreg, a resin film, a laminate or a printed circuit board. Examples include but are not limited to 4,4'-diphenylmethane bismaleimide, oligomer of phenylmethane maleimide (a.k.a. polyphenylmethane maleimide), bismaleimide toluene, diethyl-bismaleimide toluene, m-phenylene bismaleimide, bisphenol A diphenyl ether bismaleimide (a.k.a. 2,2'-bis-[4-(4-maleimidephenoxy)phenyl]propane), 3,3'-dimethyl-5,5'-diethyl-4,4'-diphenyl methane bismaleimide, 4-methyl-1,3-phenylene bismaleimide, 1,6-bismaleimide-(2,2,4-trimethyl)hexane, N-2,3-xylylmaleimide, N-2,6-xylyl maleimide, N-phenyl maleimide, maleimide resin containing a biphenyl structure, maleimide resin containing an aliphatic long-chain structure, or a combination thereof. In addition, unless otherwise specified, the maleimide resin of the present disclosure may comprise a prepolymer thereof, such as a prepolymer of diallyl compound and maleimide compound, a prepolymer of multi-functional amine (including diamine) and maleimide compound or a prepolymer of acid phenol compound and maleimide compound, but not limited thereto.

For example, the maleimide resin may include products such as BMI-TMH, BMI-1000, BMI-1000H, BMI-1100, BMI-1100H, BMI-2000, BMI-2300, BMI-3000, BMI-3000H, BMI-4000, BMI-4000H, BMI-5000, BMI-5100, BMI-7000 and BMI-7000H available from Daiwakasei Industry Co., Ltd., products such as BMI-70 and BMI-80 available from K.I Chemical Industry Co., Ltd., products such as MIR-3000 available from Nippon Kayaku, or products such as Compimide MDAB, Compimide TDAB and Compimide DE-TDAB available from Evonik Industries.

For example, the maleimide resin containing an aliphatic long-chain structure may include products such as BMI-689, BMI-1400, BMI-1500, BMI-1700, BMI-2500, BMI-3000, BMI-3000J, BMI-3000G, BMI-3000GE, BMI-5000 and BMI-6000 available from Designer Molecules Inc. For example, the maleimide resin containing an aliphatic long-chain structure may comprise a maleimide resin containing an aliphatic long-chain structure with 40-720 carbon atoms.

For example, in one embodiment, the maleimide resin of the present disclosure comprises 3,3'-dimethyl-5,5'-diethyl-4,4'-diphenylmethane bismaleimide, a compound of Formula (3), a compound of Formula (4) or a combination thereof,

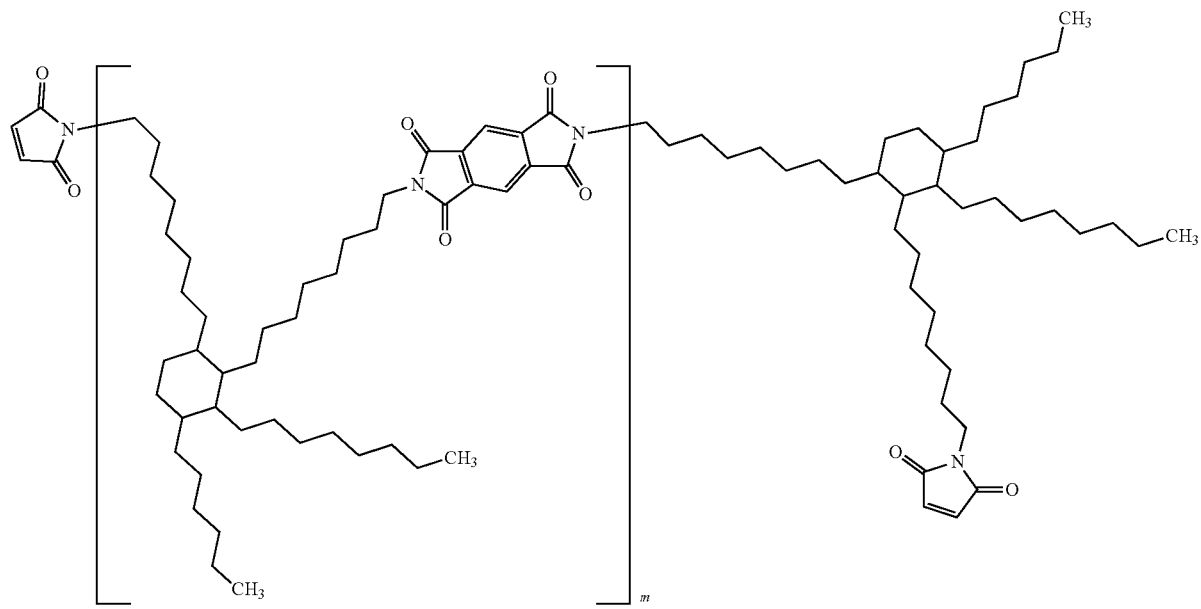

Formula (3), wherein m is an integer of 1 to 10;

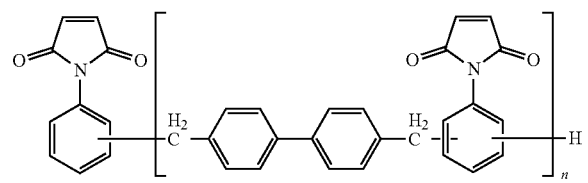

Formula (4), wherein n is an integer of 1 to 5.

For example, in one embodiment, relative to 10 parts by weight of the first prepolymer, the resin composition of the present disclosure further comprises 10 parts by weight to 30 parts by weight of the polyolefin. For example, in one embodiment, relative to 10 parts by weight of the first prepolymer, the resin composition of the present disclosure further comprises 5 parts by weight to 35 parts by weight of the maleimide resin and 10 parts by weight to 30 parts by weight of the polyolefin.

For example, in the present disclosure, unless otherwise specified, examples of the aforesaid optional polyolefin include but are not limited to styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer (a.k.a. styrene-ethylene-butene-styrene block polymer), styrene-isoprene copolymer, hydrogenated styrene-isoprene copolymer, hydrogenated styrene-butadiene-divinylbenzene terpolymer, polybutadiene (homopolymer of butadiene), maleic anhydride-butadiene copolymer, methyl styrene copolymer or a combination thereof. Preferably, the polyolefin comprises styrene-butadiene copolymer, hydrogenated styrene-butadiene copolymer, polybutadiene, styrene-butadiene-maleic anhydride terpolymer, maleic anhydride-butadiene copolymer, or a combination thereof. For example, the polybutadiene may comprise a hydrogenated polybutadiene without any reactive group. The polybutadiene may comprise a polybutadiene with a reactive group, a hydroxyl group-containing polybutadiene, a phenolic hydroxyl group-containing polybutadiene (having a polybutadiene structure and containing a phenolic hydroxyl group), a carboxyl group-containing polybutadiene, an anhydride group-containing polybutadiene, an epoxy group-containing polybutadiene, an isocyanate group-containing polybutadiene, an urethane group-containing polybutadiene, a hydrogenated polybutadiene with its terminal hydroxyl groups modified by vinyl groups (therefore without any hydroxyl group) or a combination thereof. For example, the polybutadiene may comprise an epoxy group-containing polybutadiene.

In addition to the aforesaid components or ingredients, the resin composition disclosed herein may also further optionally comprise: inorganic filler, curing accelerator, flame retardant, polymerization inhibitor, solvent, silane coupling agent, coloring agent, toughening agent or a combination thereof, but not limited thereto.

For example, the inorganic filler may be any one or more inorganic fillers used for preparing a prepreg, a resin film, a laminate or a printed circuit board; examples of the inorganic filler include but are not limited to silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (AlOOH), calcined talc, talc, silicon nitride and calcined kaolin. Moreover, the inorganic filler can be spherical, fibrous, plate-like, particulate, flake-like or whisker-like in shape and can be optionally pretreated by a silane coupling agent.

For example, the curing accelerator (including curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP). The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di(tert-butylperoxy)-3-hexyne peroxide (25B), bis(tert-butylperoxyisopropyl)benzene or a combination thereof.

For example, the flame retardant used herein may be any one or more flame retardants useful for preparing a prepreg, a resin film, a laminate or a printed circuit board, examples including but not limited to a phosphorus-containing flame retardant, preferably comprising ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO (9,10-dihydro-9-oxa-10-phosphaphenanthrene-10-oxide) and its derivatives or resins, DPPO (diphenylphosphine oxide) and its derivatives or resins, melamine cyanurate, tri-hydroxy ethyl isocyanurate, aluminium phosphinate (e.g., commercially available OP-930 and OP-935), or a combination thereof.

For example, the flame retardant may be a DPPO compound (e.g., di-DPPO compound, such as commercially available PQ-60), a DOPO compound (e.g., di-DOPO compound), a DOPO resin (e.g., DOPO-HQ, DOPO-NQ, DOPO-PN, and DOPO-BPN) and a DOPO-containing epoxy resin, wherein DOPO-PN is a DOPO phenol novolac compound, and DOPO-BPN may be a DOPO-containing bisphenol novolac compound, such as DOPO-BPAN (DOPO-bisphenol A novolac), DOPO-BPFN (DOPO-bisphenol F novolac) or DOPO-BPSN (DOPO-bisphenol S novolac).

For example, the polymerization inhibitor may comprise, but not limited to, 1,1-diphenyl-2-picrylhydrazyl radical, methyl acrylonitrile, 2,2,6,6-tetramethyl-1-oxo-piperidine, dithioester, nitroxide-mediated radical, triphenylmethyl radical, metal ion radical, sulfur radical, hydroquinone, 4-methoxyphenol, p-benzoquinone, phenothiazine, β-phenylnaphthylamine, 4-t-butylcatechol, methylene blue, 4,4'-butylidenebis(6-t-butyl-3-methylphenol), 2,2'-methylenebis(4-ethyl-6-t-butylphenol) or a combination thereof. For example, the nitroxide-mediated radical may comprise, but not limited to, nitroxide radicals derived from cyclic hydroxylamines, such as 2,2,6,6-substituted piperidine 1-oxyl free radical, 2,2,5,5-substituted pyrrolidine 1-oxyl free radical or the like. Preferred substitutes include alkyl groups with 4 or fewer carbon atoms, such as methyl group or ethyl group. Examples of the compound containing a nitroxide radical include but are not limited to 2,2,6,6-tetramethylpiperidine 1-oxyl free radical, 2,2,6,6-tetraethylpiperidine 1-oxyl free radical, 2,2,6,6-tetramethyl-4-oxo-piperidine 1-oxyl free radical, 2,2,5,5-tetramethylpyrrolidine 1-oxyl free radical, 1,1,3,3-tetramethyl-2-isoindoline oxygen radical, N,N-di-tert-butylamine oxygen free radical and so on. Nitroxide radicals may also be replaced by using stable radicals such as galvinoxyl radicals. The polymerization inhibitor suitable for the resin composition of the present disclosure may include products derived from the polymerization inhibitor with its hydrogen atom or group substituted by other atom or group. Examples include products derived from a polymerization inhibitor with its hydrogen atom substituted by an amino group, a hydroxyl group, a carbonyl group or the like.

For example, the solvent is not particularly limited and may be any solvent suitable for dissolving the resin composition disclosed herein, example including, but not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

For example, the silane coupling agent may comprise silane (such as but not limited to siloxane) and may be further categorized according to the functional groups into amino silane, epoxide silane, vinyl silane, acrylate silane, methacrylate silane, hydroxyl silane, isocyanate silane, methacryloxy silane and acryloxy silane.

For example, the coloring agent may comprise but not limited to dye or pigment.

As used herein, the purpose of adding toughening agent is to improve the toughness of the resin composition. For example, the toughening agent may comprise, but not limited to, carboxyl-terminated butadiene acrylonitrile rubber (CTBN rubber), core-shell rubber, or a combination thereof.

The resin composition of various embodiments may be processed to make different articles, such as those suitable for use as components in electronic products, including but not limited to a prepreg, a resin film, a laminate or a printed circuit board.

For example, the resin compositions of various embodiments may be used to make prepregs.

For example, the prepreg disclosed herein has a reinforcement material and a layered structure formed thereon, wherein the layered structure is made by heating the resin composition at high temperature to a semi-cured state (B-stage). Suitable baking temperature for making the prepreg may be for example 60° C. to 130° C. The reinforcement material may be a fiber material or a non-fiber material, configured as any one of woven fabric and non-woven fabric, and the woven fabric preferably comprises fiberglass fabrics. Types of fiberglass fabrics are not particularly limited and may be any commercial fiberglass fabric useful for various printed circuit boards, such as E-glass fiber fabric, D-glass fiber fabric, S-glass fiber fabric, T-glass fiber fabric, L-glass fiber fabric or Q-glass fiber fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

For example, by well mixing the resin composition to form a varnish, loading the varnish into an impregnation tank, impregnating a fiberglass fabric into the impregnation tank to adhere the resin composition onto the fiberglass fabric, and finally heating and baking the resin composition at a proper temperature to a semi-cured state, a prepreg may be obtained.

For example, the article made from the resin composition disclosed herein may be a resin film.

For example, in one embodiment, the resin film disclosed herein is prepared by heating and baking the resin composition to the semi-cured state (B-stage). For example, the resin composition may be selectively coated on a liquid crystal polymer film, a polyethylene terephthalate film (PET film) or a polyimide film; for example, the resin composition from each embodiment may be coated on a copper foil to uniformly adhere the resin composition thereon, followed by heating and baking at 60° C. to 130° C. for 5 to 15 minutes to a semi-cured state to form a resin film, so as to obtain a copper-clad resin film (i.e., resin coated copper).

For example, the resin compositions of various embodiments may be used to make laminates.

For example, in one embodiment, the laminate of the disclosure comprises at least two metal foils and an insulation layer disposed between the metal foils, wherein the insulation layer is made by curing the resin composition at high temperature and high pressure to the C-stage, a suitable curing temperature being for example between 180° C. and 270° C. and preferably between 200° C. and 250° C. and a suitable curing time being 60 to 150 minutes and preferably 90 to 120 minutes. The insulation layer may be formed by curing the aforesaid prepreg or resin film to the C-stage. The metal foil may comprise copper, aluminum, nickel, platinum, silver, gold or alloy thereof, such as a copper foil. In one embodiment, the laminate is a copper-clad laminate (CCL).

In addition, the laminate may be further processed by trace formation processes to make a circuit board, such as a printed circuit board.

In one embodiment of making a printed circuit board, a double-sided copper-clad laminate (such as product EM-891, available from Elite Material Co., Ltd.) with a thickness of 28 mil and having 0.5 ounce (oz) HVLP (hyper very low profile) copper foils may be used, which is subject to drilling and then electroplating, so as to form electrical conduction between the top layer copper foil and the bottom layer copper foil. Then the top layer copper foil and the bottom layer copper foil are etched to form inner layer circuits. Then brown oxidation and roughening are performed on the inner layer circuits to form uneven structures on the surface to increase roughness. Next, a vacuum lamination apparatus is used to laminate the assembly of a copper foil, the prepreg, the inner layer circuit, the prepreg and a copper foil stacked in said order by heating at 190° C. to 245° C. for 90 to 240 minutes to cure the insulation material of the prepregs. Next, black oxidation, drilling, copper plating and other known circuit board processes are performed on the outmost copper foils so as to obtain the printed circuit board.

In one embodiment, the resin composition disclosed herein may achieve improvement in one or more of the following properties: ratio of electroless copper plating, storage modulus, copper foil peeling strength and rolling appearance test.

For example, in one embodiment, articles made from the resin composition disclosed herein have one, more or all of the following properties:
  a ratio of electroless copper plating of 100%;
  a storage modulus as measured by reference to IPC-TM-650 2.4.24.4 of greater than or equal to 7.2 GPa, such as between 7.2 GPa and 8.9 GPa or between 8.3 GPa and 8.9 GPa, such as a storage modulus of 7.2 GPa, 7.8 GPa, 8.0 GPa, 8.3 GPa, 8.4 GPa, 8.5 GPa, 8.6 GPa, 8.7 GPa, 8.8 GPa or 8.9 GPa;
  a copper foil peeling strength as measured by reference to IPC-TM-650 2.4.8 of greater than or equal to 0.62 kgf/cm, such as between 0.62 kgf/cm and 1.20 kgf/cm or between 0.82 kgf/cm and 1.20 kgf/cm, such as a copper foil peeling strength of 0.62 kgf/cm, 0.75 kgf/cm, 0.77 kgf/cm, 0.79 kgf/cm, 0.80 kgf/cm, 0.82 kgf/cm, 0.86 kgf/cm, 0.87 kgf/cm, 0.89 kgf/cm, 0.95 kgf/cm, 1.12 kgf/cm or 1.20 kgf/cm; and passing a rolling appearance test (e.g., the resin film rolled by a 6-inch tube has a crack less than 5 mm or no cracks on the surface, and the resin film rolled by a 3-inch tube has a crack greater than or equal to 5 mm on the surface; or the resin film rolled by a 6-inch tube and a 3-inch tube has no cracks or has a crack smaller than 5 mm on the surface).

Raw materials below were used to prepare the resin compositions of various Examples and Comparative Examples of the present disclosure according to the amount listed in Table 1 to Table 4 and further fabricated to prepare test samples.

Chemical reagents used in Examples and Comparative Examples of resin composition disclosed herein and chemical reagents used in Preparation Examples of prepolymer are listed below:
  SA9000: methacrylate group-containing polyphenylene ether resin, available from Sabic.
  OPE-2st 1200: vinylbenzyl group-containing biphenyl polyphenylene ether resin, available from Mitsubishi Gas Chemical Co., Inc.
  OPE-2st 2200: vinylbenzyl group-containing biphenyl polyphenylene ether resin, available from Mitsubishi Gas Chemical Co., Inc.
  Ricon100: styrene-butadiene copolymer, available from Cray Valley.
  JP-100: epoxy group-containing polybutadiene, available from Nippon Soda Co., Ltd.
  Ricon257: styrene-butadiene-divinylbenzene terpolymer, available from Cray Valley.
  BMI-70: 3,3'-dimethyl-5,5'-diethyl-4,4'-diphenylmethane bismaleimide, available from K.I Chemical Industry Co., Ltd.
  BMI-3000: compound of Formula (3), available from Designer Molecules Inc.

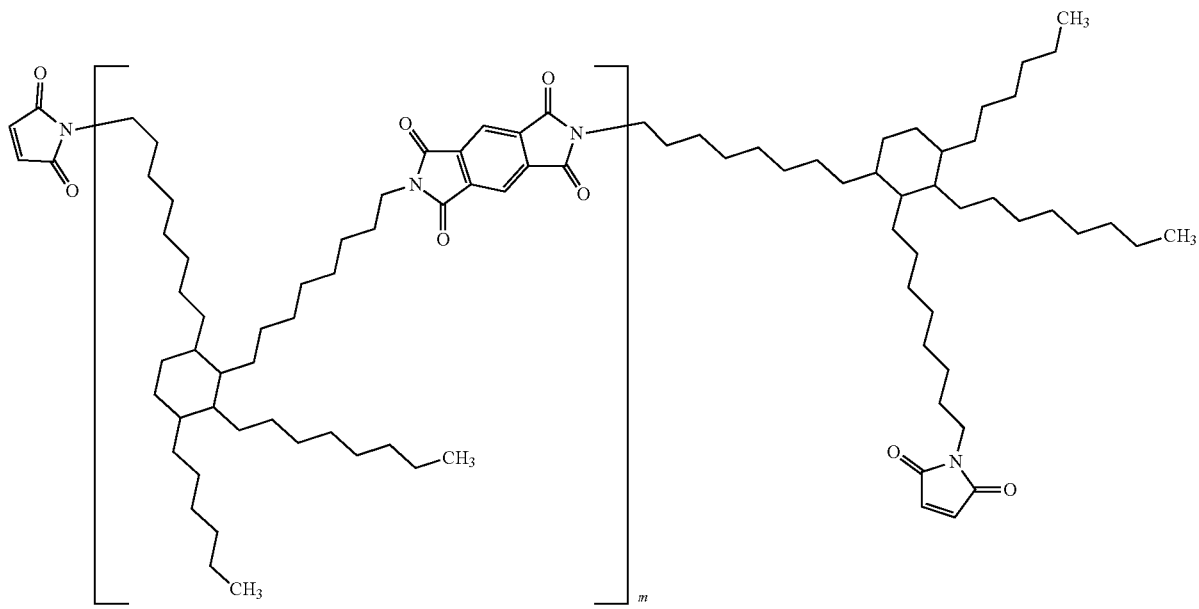

Formula (3), wherein m is an integer of 1 to 10;
MIR-3000: compound of Formula (4), available from Nippon Kayaku.

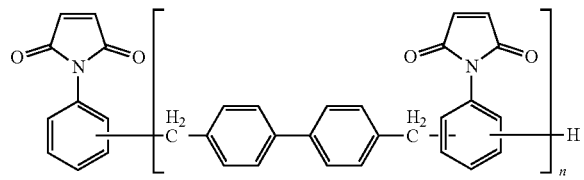

Formula (4), wherein n is an integer of 1 to 5.
BMI-2300: polyphenylmethane maleimide, available from Daiwakasei Industry Co., Ltd.
X1: compound of Formula (1), available from Shikoku Chemicals Corp.
X2: compound of Formula (2), available from Printec Co.
25B: 2,5-dimethyl-2,5-di(t-butylperoxy)-3-hexyne, available from NOF Corporation.
SC-2500-SMJ: spherical silica with surface pre-treated by methacrylate silane coupling agent, available from Admatechs.
MEK: methyl ethyl ketone, commercially available.
TFMB: 4,4'-diamino-2,2'-bis(trifluoromethyl)biphenyl, available from Sigma-Aldrich.
BMI-80: 2,2'-bis-[4-(4-maleimidephenoxy)phenyl]propane, available from K.I Chemical Industry Co., Ltd.
BMI-TMH: 1,6-bismaleimide-(2,2,4-trimethyl)hexane, available from Daiwakasei Industry Co., Ltd.
DAIP: diallyl isophthalate, available from Chembridge International Corp., Ltd.
DABPA: diallyl bisphenol A, available from Daiwakasei Industry Co., Ltd.
In the Tables, Y represents the total parts by weight of the amount symbols A, B, C, and D; Z represents the total parts by weight of the amount symbols A, B, C, D and E.

Preparation Example 1

A mixture of 100 parts by weight of maleimide resin BMI-2300, 10 parts by weight of X1 and 15 parts by weight of X2 was heated on a heater plate to 230° C. for melting and mixing for 90 seconds, followed by cooled to room temperature (about 25° C.), so as to obtain the Prepolymer 1.

Preparation Example 2

A mixture of 100 parts by weight of maleimide resin BMI-2300, 10 parts by weight of X1 and 45 parts by weight of X2 was heated on a heater plate to 230° C. for melting and mixing for 90 seconds, followed by cooled to room temperature (about 25° C.), so as to obtain the Prepolymer 2.

Preparation Example 3

A mixture of 100 parts by weight of maleimide resin BMI-2300, 30 parts by weight of X1 and 15 parts by weight of X2 was heated on a heater plate to 220° C. for melting and mixing for 95 seconds, followed by cooled to room temperature (about 25° C.), so as to obtain the Prepolymer 3.

Preparation Example 4

A mixture of 100 parts by weight of maleimide resin BMI-2300, 30 parts by weight of X1 and 45 parts by weight of X2 was heated on a heater plate to 210° C. for melting and mixing for 115 seconds, followed by cooled to room temperature (about 25° C.), so as to obtain the Prepolymer 4.

Preparation Example 5

In a reaction tank containing 150 parts by weight of dimethylacetamide, 100 parts by weight of maleimide resin BMI-2300 were added and stirred to dissolve the maleimide resin, followed by adding 15 parts by weight of 4,4'-diamino-2,2'-bis(trifluoromethyl)biphenyl (TFMB) and stirring to dissolve it. After complete dissolution, the mixture was stirred and reacted at 90° C. for 3 hours, so as to obtain the Prepolymer 5, which is a prepolymer not encompassed by the scope of the present disclosure.

Preparation Example 6

In a reaction tank containing 150 parts by weight of dimethylacetamide and 40 parts by weight of methyl ethyl ketone, 100 parts by weight of maleimide resin BMI-80 and 20 parts by weight of diallyl isophthalate (DAIP) were added, stirring to dissolve both the maleimide resin and diallyl isophthalate, followed by adding 7.5 parts by weight of 4,4'-diamino-2,2'-bis(trifluoromethyl)biphenyl (TFMB) and stirring to dissolve it. After complete dissolution, the mixture was stirred and reacted at 90° C. for 3 hours, so as to obtain the Prepolymer 6, which is a prepolymer not encompassed by the scope of the present disclosure.

Preparation Example 7

In a reaction tank containing 150 parts by weight of dimethylacetamide and 40 parts by weight of methyl ethyl ketone, 100 parts by weight of maleimide resin BMI-TMH and 10 parts by weight of diallyl isophthalate (DAIP) were added, stirring to dissolve both the maleimide resin and diallyl isophthalate, followed by adding 30 parts by weight of 4,4'-diamino-2,2'-bis(trifluoromethyl)biphenyl (TFMB) and stirring to dissolve it. After complete dissolution, the mixture was stirred and reacted at 90° C. for 3 hours, so as to obtain the prepolymer 7, which is a prepolymer not encompassed by the scope of the present disclosure.

Compositions and test results of resin compositions of Examples and Comparative Examples are listed below (in part by weight):

TABLE 1

Resin compositions of Examples (in part by weight) and test results

| Component | Name | Symbol | E1 | E2 | E3 | E4 | E5 | E6 |
|---|---|---|---|---|---|---|---|---|
| first prepolymer | Prepolymer 1 | A | 10 | 10 | 10 | 10 | 10 | 10 |
| | Prepolymer 2 | | | | | | | |
| | Prepolymer 3 | | | | | | | |
| | Prepolymer 4 | | | | | | | |
| second prepolymer | Prepolymer 5 | | | | | | | |
| | Prepolymer 6 | | | | | | | |
| | Prepolymer 7 | | | | | | | |
| vinyl group-containing polyphenylene ether resin | SA9000 | B | 10 | 5 | 30 | 30 | 30 | 30 |
| | OPE-2st 1200 | | | | | | | |
| | OPE-2st 2200 | | | | | | | |
| polyolefin | Ricon100 | C | | | | | | |
| | JP-100 | | | | | | | |
| | Ricon257 | | | | | | | |
| maleimide resin | BMI-70 | | | | | | | |
| | BMI-3000 | | | | | | | |
| | MIR-3000 | | | | | | 20 | 5 | 35 |
| | BMI-2300 | | | | | | | |
| compound of Formula (1) | X1 | D | | | | | | |
| compound of Formula (2) | X2 | | | | | | | |
| curing accelerator | 25B | | | | | | | |
| inorganic filler | SC-2500-SMJ | E | Y*1.0 | Y*1.0 | Y*1.0 | Y*1.0 | Y*1.0 | Y*1.0 |
| solvent | MEK | — | Z*0.33 | Z*0.33 | Z*0.33 | Z*0.33 | Z*0.33 | Z*0.33 |

| Property | Unit | E1 | E2 | E3 | E4 | E5 | E6 |
|---|---|---|---|---|---|---|---|
| ratio of electroless copper plating | % | 100 | 100 | 100 | 100 | 100 | 100 |
| storage modulus | GPa | 7.8 | 7.8 | 8.0 | 8.5 | 8.3 | 8.9 |
| copper foil peeling strength | kgf/cm | 0.79 | 0.80 | 0.77 | 0.87 | 0.82 | 0.89 |
| rolling appearance | — | Δ | Δ | Δ | Δ | Δ | Δ |

TABLE 2

Resin compositions of Examples (in part by weight) and test results

| Component | Name | Symbol | E7 | E8 | E9 | E10 | E11 | E12 | E13 |
|---|---|---|---|---|---|---|---|---|---|
| first prepolymer | Prepolymer 1 | A | 10 | 10 | 10 | 10 | 10 | 3 | 4 |
| | Prepolymer 2 | | | | | | | 2 | 2 |
| | Prepolymer 3 | | | | | | | 1 | 2 |
| | Prepolymer 4 | | | | | | | 4 | 2 |
| second prepolymer | Prepolymer 5 | | | | | | | | |
| | Prepolymer 6 | | | | | | | | |
| | Prepolymer 7 | | | | | | | | |
| vinyl group-containing polyphenylene ether resin | SA9000 | B | 30 | 30 | 30 | 30 | 30 | 16 | 10 |
| | OPE-2st 1200 | | | | | | | 6 | 10 |
| | OPE-2st 2200 | | | | | | | 6 | 5 |

TABLE 2-continued

Resin compositions of Examples (in part by weight) and test results

| | | | | | | | | | |
|---|---|---|---|---|---|---|---|---|---|
| polyolefin | Ricon100 | C | 15 | 10 | 30 | | | | 10 |
| | JP-100 | | | | | | | 8 | 10 |
| | Ricon257 | | | | | | | 5 | 5 |
| maleimide resin | BMI-70 | | | | | 20 | | 5 | 2 |
| | BMI-3000 | | | | | | 20 | 5 | 3 |
| | MIR-3000 | | 20 | 20 | 20 | | | 10 | 30 |
| | BMI-2300 | | | | | | | | |
| compound of Formula (1) | X1 | D | | | | | | | |
| compound of Formula (2) | X2 | | | | | | | | |
| curing accelerator | 25B | | | | | | | | |
| inorganic filler | SC-2500-SMJ | E | Y*1.0 | Y*1.0 | Y*1.0 | Y*1.0 | Y*1.0 | Y*1.5 | Y*2.5 |
| solvent | MEK | — | Z*0.33 | Z*0.33 | Z*0.33 | Z*0.33 | Z*0.33 | Z*0.30 | Z*0.35 |

| Property | Unit | E7 | E8 | E9 | E10 | E11 | E12 | E13 |
|---|---|---|---|---|---|---|---|---|
| ratio of electroless copper plating | % | 100 | 100 | 100 | 100 | 100 | 100 | 100 |
| storage modulus | GPa | 8.4 | 8.3 | 8.6 | 8.0 | 7.2 | 8.7 | 8.8 |
| copper foil peeling strength | kgf/cm | 0.86 | 0.82 | 0.95 | 0.62 | 0.75 | 1.12 | 1.20 |
| rolling appearance | — | ○ | ○ | ○ | X | Δ | ○ | ○ |

TABLE 3

Resin compositions of Comparative Examples (in part by weight) and test results

| Component | Name | Symbol | C1 | C2 | C3 | C4 | C5 |
|---|---|---|---|---|---|---|---|
| first prepolymer | Prepolymer 1 | A | 10 | 10 | | 10 | |
| | Prepolymer 2 | | | | | | |
| | Prepolymer 3 | | | | | | |
| | Prepolymer 4 | | | | | | |
| second prepolymer | Prepolymer 5 | | | 3 | 10 | | |
| | Prepolymer 6 | | | | | | |
| | Prepolymer 7 | | | | | | |
| vinyl group-containing polyphenylene ether resin | SA9000 | B | 30 | 30 | 30 | | 30 |
| | OPE-2st 1200 | | | | | | |
| | OPE-2st 2200 | | | | | | |
| polyolefin | Ricon100 | C | | | | | |
| | JP-100 | | | | | | |
| | Ricon257 | | | | | | |
| maleimide resin | BMI-70 | | | | | | |
| | BMI-3000 | | | | | | |
| | MIR-3000 | | | | | | |
| | BMI-2300 | | | | | 8 | |
| compound of Formula (1) | X1 | D | | | | 0.8 | |
| compound of Formula (2) | X2 | | | | | 1.2 | |
| curing accelerator | 25B | | | | | | |
| inorganic filler | SC-2500-SMJ | E | Y*1.0 | Y*1.0 | Y*1.0 | Y*1.0 | Y*1.0 |
| solvent | MEK | — | Z*0.33 | Z*0.33 | Z*0.33 | Z*0.33 | Z*0.33 |

| Property | Unit | C1 | C2 | C3 | C4 | C5 |
|---|---|---|---|---|---|---|
| ratio of electroless copper plating | % | 82 | 54 | 100 | 100 | cannot be formed |
| storage modulus | GPa | 7.9 | 8.0 | 7.5 | 7.6 | |
| copper foil peeling strength | kgf/cm | 0.55 | 0.42 | 0.57 | 0.53 | |
| rolling appearance | — | X | X | X | X | |

TABLE 4

Resin compositions of Comparative Examples (in part by weight) and test results

| Component | Name | Symbol | C6 | C7 | C8 | C9 | C10 |
|---|---|---|---|---|---|---|---|
| first prepolymer | Prepolymer 1 | A | | | | 10 | 10 |
| | Prepolymer 2 | | | | | | |

TABLE 4-continued

Resin compositions of Comparative Examples (in part by weight) and test results

| | | | | | | | |
|---|---|---|---|---|---|---|---|
| second prepolymer | Prepolymer 3 | | | | | | |
| | Prepolymer 4 | | | | | | |
| | Prepolymer 5 | | | | | | |
| | Prepolymer 6 | | | | | | 3 | |
| | Prepolymer 7 | | | | | | | 3 |
| vinyl group-containing polyphenylene ether resin | SA9000 | B | 30 | 30 | 30 | 30 | 30 |
| | OPE-2st 1200 | | | | | | |
| | OPE-2st 2200 | | | | | | |
| polyolefin | Ricon100 | C | | | | 15 | |
| | JP-100 | | | | | | |
| | Ricon257 | | | | | | |
| maleimide resin | BMI-70 | | | | | | |
| | BMI-3000 | | | | | | |
| | MIR-3000 | | | | 20 | 20 | |
| | BMI-2300 | | | | | | |
| compound of Formula (1) | X1 | D | | | | | |
| compound of Formula (2) | X2 | | | | | | |
| curing accelerator | 25B | | 0.5 | | | | |
| inorganic filler | SC-2500-SMJ | E | Y*1.0 | Y*1.0 | Y*1.0 | Y*1.0 | Y*1.0 |
| solvent | MEK | — | Z*0.33 | Z*0.33 | Z*0.33 | Z*0.33 | Z*0.33 |

| Property | Unit | C6 | C7 | C8 | C9 | C10 |
|---|---|---|---|---|---|---|
| ratio of electroless copper plating | % | 100 | 100 | 100 | 82 | 80 |
| storage modulus | GPa | 7.0 | 7.8 | 7.0 | 8.0 | 7.5 |
| copper foil peeling strength | kgf/cm | 0.25 | 0.38 | 0.49 | 0.57 | 0.53 |
| rolling appearance | — | X | X | Δ | X | X |

Samples (specimens) for the properties measured above were prepared as described below and tested and analyzed under specified conditions below.

1. Copper-clad resin film 1: Resin composition from each Example E1-E13 or each Comparative Example C1-C10, in part by weight, was individually added to a stirred tank and well-mixed to form a varnish, which was coated on a copper foil (product name MT18Ex, containing 18 µm carrier copper foil and 3 µm ultra-thin copper foil, available from Mitsui Kinzoku) to uniformly adhere the resin composition thereon, followed by heating and baking at 80° C. for 10 minutes to obtain each copper-clad resin film 1, which contains one resin film layer, one ultra-thin copper layer and one carrier copper foil layer, wherein the thickness of the resin film layer was 32.5 µm.
2. Copper-clad resin film 2: One copper-clad resin film 1 was prepared. After removing the 18 µm carrier copper foil, the 3 µm ultra-thin copper foil was thickened to 18 µm by electroplating, so as to obtain a copper-clad resin film 2.
3. Copper-containing laminate (formed by laminating two copper-clad resin films 2): Two copper-clad resin films 2 obtained as described above were prepared and stacked, wherein two resin film layers were adjacent to each other, and two outer sides were the copper foil layers, followed by lamination and curing for 2.5 hours in a high temperature laminator filled with nitrogen with a lamination pressure of 2000 psi and a lamination temperature of 230° C. to form a copper-containing laminate (formed by laminating two copper-clad resin films 2).
4. Copper-free laminate (formed by laminating two copper-clad resin films 2): Each aforesaid copper-containing laminate (formed by laminating two copper-clad resin films 2) was etched to remove the copper foils on both sides to obtain a copper-free laminate (formed by laminating two copper-clad resin films 2).
5. Resin film 1: One copper-clad resin film 1 obtained as described above was prepared. After removing the 18 µm carrier copper foil, the 3 µm ultra-thin copper foil was removed by etching, so as to obtain each resin film 1, wherein the thickness of the resin film 1 was 32.5 µm.
6. Resin film 2: Resin composition from each Example E1-E13 or each Comparative Example C1-C10 was individually added to a stirred tank and well-mixed to form a varnish, which was coated on a polyethylene terephthalate film (PET film, with a thickness of 50 µm) to uniformly adhere the resin composition thereon, followed by heating and baking at 80° C. for 10 minutes to obtain each PET-clad resin film, which contains one resin film layer and one PET layer, wherein the thickness of the resin film layer was 32.5 µm.

For each sample, test items and test methods are described below:

Ratio of Electroless Copper Plating

The resin film 2 was cut into a sample with a length of 10 cm and a width of 10 cm. On the resin film layer, electroless copper plating with a target thickness of 5 µm was performed to obtain a copper layer. Next, grids with a length of 10 mm and a width of 10 mm were drawn on the surface of the copper layer, for a total of 100 grids. The appearance of each grid was observed by naked eyes; any area in any grid having a white area greater than or equal to 1 mm*1 mm represents the grid is unevenly copper-plated, and a designation of "FAIL" is given; in contrast, if any area in any grid is absent of a white area or has a white area smaller than 1mm*1mm, a designation of "PASS" is given. Ratio of electroless copper plating=(number of PASS/100 grids) *100%. In the technical field to which the present disclosure pertains, higher ratio of electroless copper plating is better. Generally, a difference in ratio of electroless copper plating of greater than 10% represents a significant difference (i.e., significant technical difficulty).

Storage Modulus

The copper-free laminate (formed by laminating two copper-clad resin films 2) sample was subjected to the measurement. The storage modulus of each sample was measured by using a dynamic mechanical analysis (DMA) method by reference to IPC-TM-650 2.4.24.4 at a temperature range of 25° C. to 300° C. with a temperature increase rate of 2° C./minute, and the storage modulus (in GPa) at 50° C. was recorded. Higher storage modulus represents higher laminate support and therefore higher pressure resistance without deformation. Generally, a difference in storage modulus of greater than 0.1 GPa represents a significant difference (i.e., significant technical difficulty).

Copper Foil Peeling Strength (P/S)

The copper-containing laminate (obtained by laminating two copper-clad resin films 2) was cut into a rectangular specimen with a width of 24 mm and a length of greater than 60 mm, which was etched to remove surface copper foil, leaving a rectangular copper foil with a width of 3.18 mm and a length of greater than 60 mm, and tested by using a tensile strength tester by reference to IPC-TM-650 2.4.8 at room temperature (about 25° C.) to measure the force (kgf/cm) required to separate the copper foil from the insulation layer of the laminate. In the technical field to which the present disclosure pertains, higher copper foil peeling strength is better. Generally, a difference in copper foil peeling strength of greater than 0.03 kgf/cm represents a significant difference (i.e., significant technical difficulty).

Rolling Appearance

The resin film 1 was cut into a specimen with a width of 600 mm and a length of 100 m, which was sequentially rolled by a 6-inch tube and a 3-inch tube, and defined by the following properties:

X: The resin film 1 was rolled by a 6-inch tube and a 3-inch tube, both having a crack greater than or equal to 5 mm on the surface;

Δ: The resin film 1 was rolled by a 6-inch tube, having a crack smaller than 5 mm on the surface or having no cracks, and the resin film 1 was rolled by a 3-inch tube, having a crack greater than or equal to 5 mm on the surface;

O: The resin film 1 was rolled by a 6-inch tube and a 3-inch tube, both having no cracks or having a crack smaller than 5 mm on the surface.

The following observations can be made according to the test results above.

In contrast to the first prepolymer from Example E1, formed by using a polyphenylmethane maleimide, a compound of Formula (1) and a compound of Formula (2), the second prepolymer formed by using a maleimide and bis(trifluoromethyl)benzidine, such as in Comparative Examples C1, C2, C9 and C10, fails to achieve desirable improvement in ratio of electroless copper plating and copper foil peeling strength.

In contrast to Example E1, Comparative Examples C3, C5 and C6 do not contain the first prepolymer of the present disclosure, wherein Comparative Example C3 contains a vinyl group-containing polyphenylene ether resin and further contains a polyphenylmethane maleimide, a compound of Formula (1) and a compound of Formula (2), Comparative Example C5 only contains a vinyl group-containing polyphenylene ether resin and Comparative Example C6 contains a vinyl group-containing polyphenylene ether resin and further contains a curing accelerator, all failing to form an article or failing to achieve at least one of desirable improvements in properties including storage modulus and copper foil peeling strength.

In contrast to Example E1, Comparative Example C4 not containing a vinyl group-containing polyphenylene ether resin fails to achieve desirable improvement in copper foil peeling strength.

In contrast to Example E1, Comparative Examples C7 and C8 do not contain the first prepolymer of the present disclosure, wherein Comparative Example C7 contains a vinyl group-containing polyphenylene ether resin and further contains a maleimide resin and Comparative Example C8 contains a vinyl group-containing polyphenylene ether resin and further contains a polyolefin and a maleimide resin, both failing to achieve at least one of desirable improvements in properties including storage modulus and copper foil peeling strength.

Overall, the resin composition of the present disclosure can achieve at the same time desirable properties including a ratio of electroless copper plating of 100%, a storage modulus of greater than or equal to 7.2 GPa and a copper foil peeling strength of greater than or equal to 0.62 kgf/cm.

The above detailed description is merely illustrative in nature and is not intended to limit the embodiments of the subject matter or the application and use of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A resin composition comprising 10 parts by weight of a first prepolymer and 5 parts by weight to 30 parts by weight of a vinyl group-containing polyphenylene ether resin, wherein:

the first prepolymer is prepared by subjecting a reaction mixture to a prepolymerization reaction, and the reaction mixture comprises a polyphenylmethane maleimide, a compound of Formula (1) and a compound of Formula (2) at a weight ratio of 100:10-30:15-45, Formula (1)

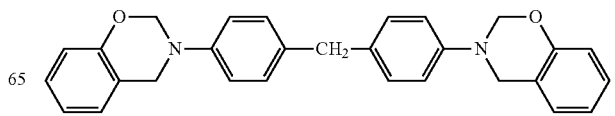

Formula (2)

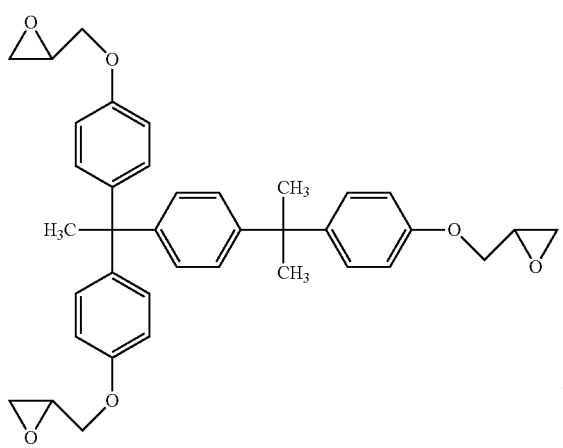

and
the resin composition is absent of a second prepolymer which is prepared by subjecting a maleimide and bis(trifluoromethyl)benzidine to a prepolymerization reaction.

2. The resin composition of claim 1, wherein the vinyl group-containing polyphenylene ether resin comprises a vinylbenzyl group-containing biphenyl polyphenylene ether resin, a methacrylate group-containing polyphenylene ether resin, a vinylbenzyl group-containing bisphenol A polyphenylene ether resin, or a combination thereof.

3. The resin composition of claim 1, further comprising 5 parts by weight to 35 parts by weight of a maleimide resin, the maleimide resin comprising 3,3'-dimethyl-5,5'-diethyl-4,4'-diphenylmethane bismaleimide, a compound of Formula (3), a compound of Formula (4) or a combination thereof, Formula (3), wherein m is an integer of 1 to 10;

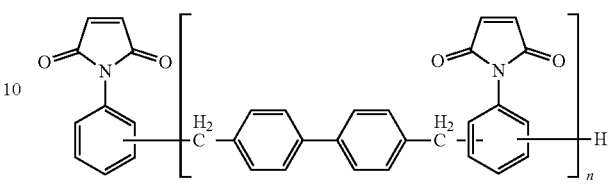

Formula (4), wherein n is an integer of 1 to 5.

4. The resin composition of claim 1, further comprising 10 parts by weight to 30 parts by weight of a polyolefin, the polyolefin comprising a styrene-butadiene copolymer, an epoxy group-containing polybutadiene, a styrene-butadiene-divinylbenzene terpolymer or a combination thereof.

5. The resin composition of claim 1, further comprising inorganic filler, curing accelerator, flame retardant, polymerization inhibitor, solvent, silane coupling agent, coloring agent, toughening agent or a combination thereof.

6. An article made from the resin composition of claim 1, comprising a prepreg, a resin film, a laminate or a printed circuit board.

7. The article of claim 6, having a ratio of electroless copper plating of 100%.

8. The article of claim 6, having a storage modulus as measured by reference to IPC-TM-650 2.4.24.4 of greater than or equal to 7.2 GPa.

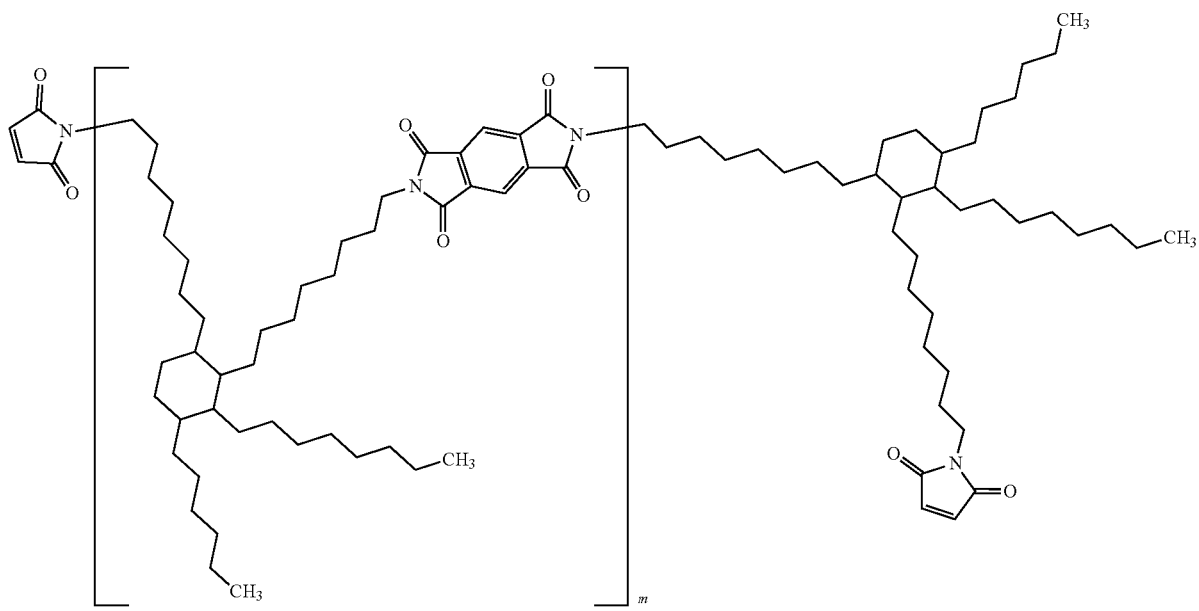

9. The article of claim 6, having a copper foil peeling strength as measured by reference to IPC-TM-650 2.4.8 of greater than or equal to 0.62 kgf/cm.

* * * * *